United States Patent [19]

Ishizaka et al.

[11] Patent Number: 4,871,952
[45] Date of Patent: Oct. 3, 1989

[54] MOTOR SPEED CONTROL APPARATUS

[75] Inventors: Kouichi Ishizaka; Akimitsu Ebina, both of Saitama, Japan

[73] Assignee: Jidosha Kiki Co., Ltd., Tokyo, Japan

[21] Appl. No.: 179,416

[22] Filed: Apr. 8, 1988

[30] Foreign Application Priority Data

Apr. 9, 1987 [JP] Japan .............................. 62-52690[U]

[51] Int. Cl.⁴ .............................................. H02P 7/06
[52] U.S. Cl. .................................... 388/829; 388/915; 180/142
[58] Field of Search ................................ 318/306–317, 318/339–341; 364/424, 425; 180/132, 141–143; 388/803–806, 819–820, 828

[56] References Cited

U.S. PATENT DOCUMENTS

| | | | |
|---|---|---|---|
| 3,883,786 | 5/1975 | McNaughton | 318/317 |
| 4,622,500 | 11/1986 | Budelman, Jr. | 318/341 |
| 4,626,994 | 12/1986 | Yabe et al. | 364/424 |
| 4,680,516 | 7/1987 | Guzik et al. | 318/341 |
| 4,739,237 | 4/1988 | Maruta | 318/608 |

OTHER PUBLICATIONS

Japanese Laid–Open Utility Model Specification No. Sho 60-62370.

Primary Examiner—William M. Shoop, Jr.
Assistant Examiner—David Martin
Attorney, Agent, or Firm—Blakely, Sokoloff, Taylor & Zafman

[57] ABSTRACT

A motor speed control apparatus includes a ladder resistor circuit, a reference signal generator, and a comparator. The ladder resistor circuit selectively receives a voltage signal having a predetermined amplitude at a plurality of nodes. The ladder resistor circuit arranged to change an output voltage value thereof in accordance with a voltage application position. The level of the reference signal generator is periodically changed. The comparator compares a voltage value of the reference signal with an output voltage value of the ladder resistor circuit and outputs a pulse output having a variable pulse width on the basis of a comparison result. A motor speed is controlled on the basis of the pulse output.

1 Claim, 3 Drawing Sheets

MOTOR SPEED CONTROL APPARATUS

BACKGROUND OF THE INVENTION

The present invention relates to a motor speed control apparatus for receiving a bit signal from a microcomputer or the like and changing a pulse width of a pulse signal.

In recent years, an electric motor driven pump type power steering system has been developed as a power steering apparatus for a vehicle. A conventional power steering system of this type uses an electric motor as a power source to drive an oil pump. A flow rate of an oil delivered from the oil pump is controlled to allow a driver to operate a steering wheel with an optimal steering force. The speed of the electric motor is controlled in accordance with a vehicle speed and a steering angle, and hence a flow rate of the oil delivered from the oil pump is changed. During low-speed travel requiring a large steering force, the flow rate of the oil delivered from the oil pump is increased. To the contrary, during high-speed travel requiring a small steering force, the delivery amount of oil is decreased, thereby allowing steering with an optimal steering force in a wide vehicle speed range.

In such a conventional electric motor driven pump type power steering system, a pulse width modulation (PWM) scheme generally using a microcomputer is employed as a method of controlling the speed of the electric motor. More specifically, as shown in FIG. 4, information associated with a vehicle speed, a steering angle, and the like is input to and processed by a microcomputer 1, and a pulse signal (PWM signal) having a duty ratio corresponding to the operating condition is generated. The generated PWM signal is supplied to the base of a power transistor 2 through a PWM terminal 1a. The duty ratio of the power transistor 2 can be controlled to change the average voltage applied to an electric motor 3. Therefore, the speed of the electric motor 3 is variably changed to control the flow rate of the oil delivered from an oil pump (not shown). Its typical example is described in U.S. Pat. No. 4,626,994 issued on Dec. 2, 1986. In the system described in this prior art patent, the travel conditions are classified into several modes in accordance with combinations of vehicle speeds and steering angles. In each mode, a combination of the vehicle speed and the pump speed, i.e., a combination of the vehicle speed and the motor speed is changed. For this purpose, the duty ratio of a control signal supplied to the motor is changed to change the motor speed.

In the above method of controlling the electric motor, since the PWM signal supplied to the base of the power transistor 2 is generated in the microcomputer 1, a capacity of a memory for storing a program for generating the PWM signal is excessively increased. Therefore, the microcomputer 1 must have a large capacity. Various operation functions are provided to the microcomputer 1 in addition to the function for generating the PWM signal. There is a fear of interfering other operations due to the time required for generating the PWM signal having a higher priority. As a result, a high-speed, expensive microcomputer must be used.

SUMMARY OF THE INVENTION

It is an object of the present invention to provide a motor speed control apparatus which requires an inexpensive microcomputer.

In order to achieve the above object of the present invention, there is provided a motor speed control apparatus comprising ladder resistor means for selectively receiving a voltage signal having a predetermined amplitude at a plurality of nodes, the ladder resistor means being arranged to change an output voltage value thereof in accordance with a voltage application position, reference signal generating means for generating a reference signal, a level of which is periodically changed, comparing means for comparing a voltage value of the reference signal with an output voltage value of the ladder resistor means and outputting a pulse output having a variable pulse width on the basis of a comparison result, wherein a motor speed is controlled on the basis of the pulse output.

According to the present invention, since the inexpensive microcomputer can be additionally arranged and a PWM signal can be generated on the basis of a bit signal generated by the microcomputer.

DESCRIPTION OF THE PREFERRED EMBODIMENT

Figure 1:
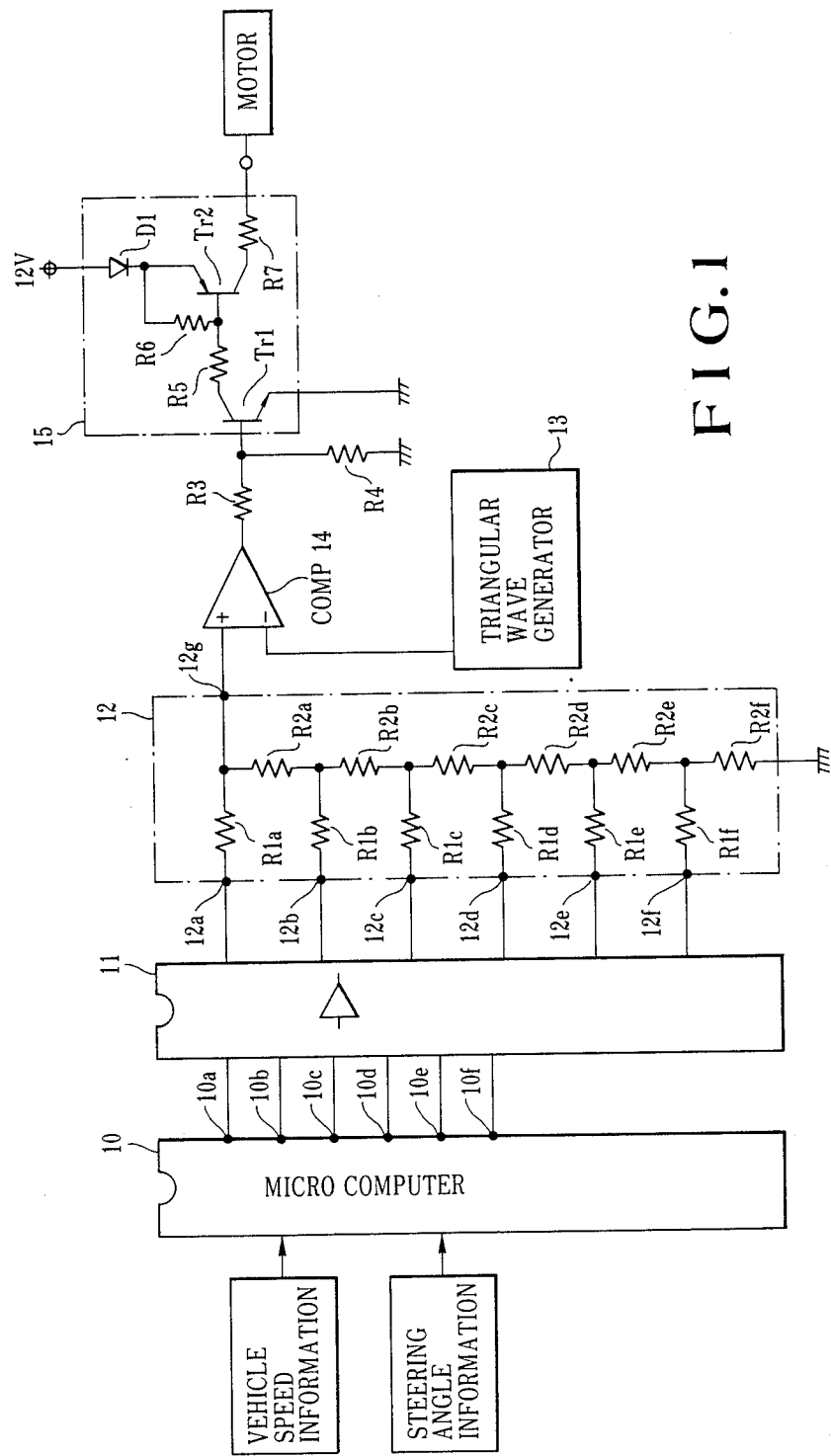
FIG. 1 is a circuit diagram of a motor speed control apparatus according to an embodiment of the present invention.

A motor speed control apparatus according to an embodiment of the present invention will be described in detail below. FIG. 1 shows this motor speed control apparatus. Referring to FIG. 1, reference numeral 10 denotes a microcomputer; 11, a C-MOS buffer IC; 12, a 2R-R ladder resistor circuit; 13, a triangular wave generator; 14, a comparator; and 15, a power transistor circuit obtained by Darlington-connecting transistors Tr1 and Tr2.

The microcomputer 10 receives information associated with a vehicle speed, a steering angle, and the like. The operating condition of the vehicle is detected on the basis of these pieces of information. An output terminal (one of 10a to 10f) corresponding to the operating condition is selected. The output level of the selected output terminal is set at "H" level. The output terminals 10a to 10f are respectively connected to input terminals 12a to 12f of the 2R-R ladder resistor circuit 12 through the C-MOS buffer 11. One terminal of each of resistors R1a to R1f is connected to a corresponding one of the input terminals 12a to 12f. The other input terminal of the resistor R1a is connected to a series circuit of resistors R2a to R2f. The other terminal of the resistor R1b is connected to a connecting point between the resistors R2a and R2b. The other terminal of the resistor R1c is connected to a connecting point between the resistors R2b and R2c. The other terminal of the resistor R1d is connected to a connecting point between the resistors R2c and R2d. The other terminal of the resistor R1f is connected to a connecting point between the resistors R2e and R2f. A connecting point between the resistors R1a and R2a is connected to an output terminal 12g. An output voltage appearing at the output terminal 12g of the 2R-R ladder resistor circuit 12 is input to the noninverting input terminal of the comparator 14. In the 2R-R ladder resistor circuit 12, the resistances of the resistors R1a to R1f and R2f are equal to each other. The resistances of the resistors R2a to R2e are equal to each other. Each of the resistances of the resistors R1a to R1f and R2f is twice each of the resistances of the resistors R2a to R2e. If each resistance of the resistors R2a to R2e is defined as R, each resistance of the resistors R1a to R1f and R2f is given as 2R.

Figure 2:
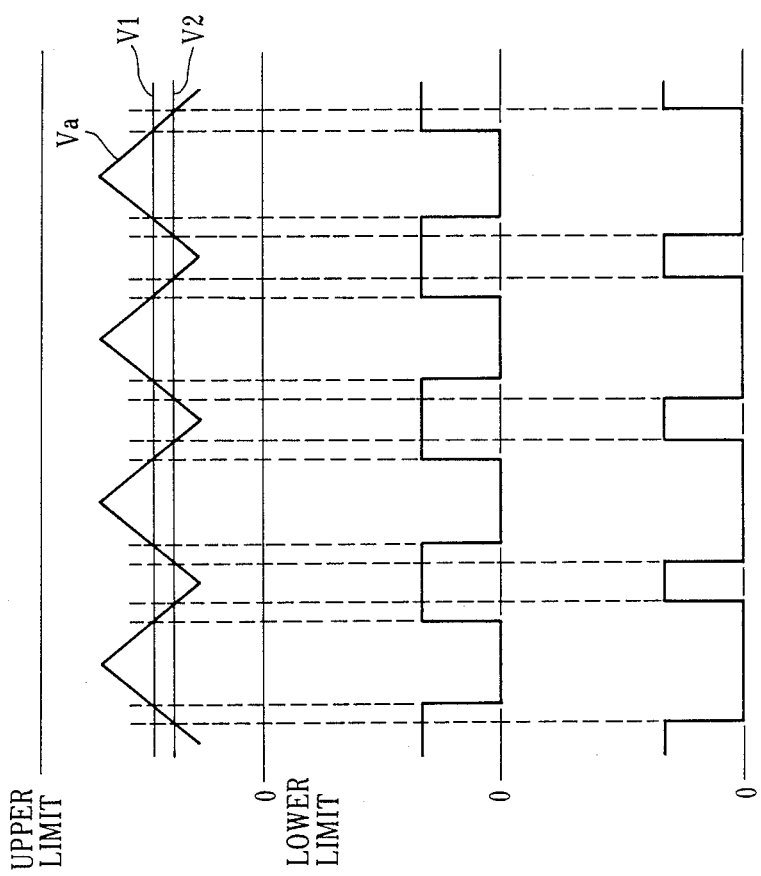
FIGS. 2A to 2C are timing charts for explaining the operation of a comparator in the motor speed control apparatus shown in FIG. 1.

The inverting input terminal of the comparator 14 receives a triangular wave signal generated by the triangular wave generator 13, i.e., a triangular wave voltage signal Va, the voltage value of which is changed with respect to a reference level, as shown in FIG. 2A. A series circuit of resistors R3 and R4 is connected between the output terminal of the comparator 14 and ground. A divided voltage appearing at a connecting point between the resistors R3 and R4 is applied to the base of the transistor Tr1 as a drive voltage to the power transistor circuit 15. It should be noted that the collector of the transistor Tr1 in the power transistor circuit 15 is connected to the base of the transistor Tr2 through a resistor R5 and that a DC voltage of 12V is applied to the emitter of the transistor Tr2 through a diode D1. A resistor R6 is connected between the emitter and base of the transistor Tr2. An electric motor (not shown) is connected to the collector of the transistor Tr2 through a resistor R7.

The operation of the circuit having the arrangement described above will be described below. When the microcomputer 10 detects the vehicle operating condition on the basis of the input information associated with the vehicle speed and the steering angle, one of the terminals 10a to 10f which corresponds to the detected operating condition is selected and its output is set at "H" level. For example, when the output terminal 10a is set at "H" level, a bit signal of "H" level as a voltage signal is applied to the input terminal 12a of the 2R-R ladder resistor circuit 12 through the C-MOS buffer 11. A divided voltage V1 appears at the connecting point between the resistors R1a and R2a. The voltage V1 is input to the noninverting input terminal of the comparator 14 through the output terminal 12g. The divided voltage V1 is taken into consideration. When the output terminal 10a of the microcomputer 10 is selected and set at "H" level, and the remaining output terminals 10b to 10f are set at "L" level, one end of each of the resistors R1b to R1f in the 2R-R ladder resistor circuit 12 is set at a potential equal to the ground potential. More specifically, assume that a combined resistance in the parallel circuit of the resistors R1f and R2f is given as R. A resistance as a sum of the resistance R and the resistances of resistors R2e and R1e connected to the parallel circuit of the resistors R1f and R2f is given as R. A final sum resistance of a circuit connected in series with the resistor R1a is given as 2R. Therefore, the divided voltage V1 input to the noninverting input terminal of the comparator 14 is ½ the voltage applied to the input terminal 12a of the 2R-R ladder resistor circuit 12. When an output current of the C-MOS buffer 11 is small, its output voltage can be kept almost constant (constant amplitude) and can serve as a power source voltage (DC 5 V in this embodiment). A stable DC voltage of 2.5 V as the divided voltage V1 is input to the noninverting input terminal of the comparator 14.

The substantially triangular wave voltage signal Va (FIG. 2A) is input to the inverting input terminal of the comparator 14 through the triangular wave generator 13. In the comparator 14, the triangular wave voltage signal Va is compared with the divided voltage V1. The voltage level of the divided voltage V1 is located at the middle amplitude between the upper and lower peaks of the triangular wave voltage signal Va, as shown in FIG. 2A. The comparator 14 outputs a voltage signal (pulse signal) of "H" level while the level of the triangular wave voltage signal Va is lower than the level of the divided voltage V1, as shown in FIG. 2B. The ON/OFF operation of the transistors in the powder transistor circuit 15 is controlled on the basis of a pulse width of the pulse signal output from the comparator 14. The average value of the voltage applied to the electric motor connected to the power transistor circuit 15 is determined.

In this state, when the microcomputer 10 detects a change in vehicle operating condition, one of the output signals 10a to 10f which corresponds to the detected operating condition is selected, and its output is set at "H" level. For example, assume that the output terminal 10b is selected and is set at "H" level, and that the remaining output terminals are set at "L" level. A divided voltage V2 appears at the connecting point between the resistors R1a and R2a in the 2R-R ladder resistor circuit 2. The value of this divided voltage V2 is given as ½ (i.e., 1.25V) the voltage V1. The input voltage value of the noninverting input terminal of the comparator 14 is decreased (FIG. 2A). The pulse width of the pulse signal output from the comparator 14 is narrowed, as shown in FIG. 2C. As a result, the ON period of the transistors in the power transistor circuit 15 is shortened, and the average value of the voltage applied to the electric motor is decreased. Assume that the output terminal 10c is selected and set at "H" level, and that the remaining output terminals are set at "L" level. A divided voltage appearing at the connecting point between the resistors R1a and R2a in the 2R-R ladder resistor circuit 12 is ¼ (i.e., 0.625 V) the divided voltage V2. When the output terminal to be set at "H" level is shifted in an order of 10d, 10e, and 10f, the resultant divided voltages are sequentially decreased at a rate of ½. In other words, the pulse width of the pulse signal output from the comparator 14 is changed in accordance with the position of the output terminal of "H" level in the microcomputer 10, i.e., the input position of the bit signal to the C-MOS buffer 11. The driving duty ratio of the power transistor circuit 15 is changed, and the average value of the voltage applied to the motor is controlled. In the above embodiment, for the sake of simplicity, only one output terminal of the microcomputer 10 is set at "H" level, and the remaining output terminals thereof are set at "L" level. However, some output terminals may be combined and set at "H" level in accordance with a given operating condition. It is natural that the pulse signal output from the comparator 14 be PWM-modulated in accordance with a combination of input positions of the bit pulses in the C-MOS buffer 11.

The operation of the microcomputer 10 will be described in more detail.

Figure 4:
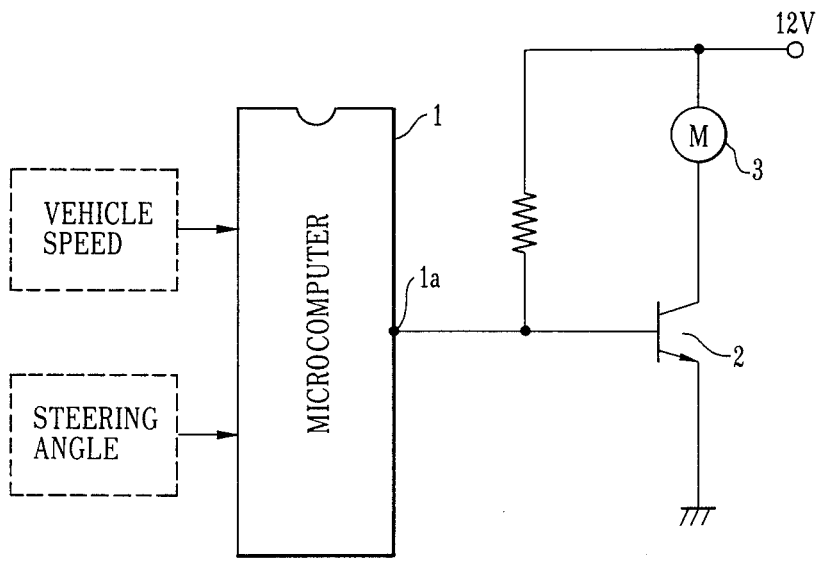
FIG. 4 is a diagram for explaining pulse width modulation in a conventional power steering apparatus.

The microcomputer used in this embodiment receives information associated with a vehicle speed, a steering angle, and the like, as previously described. The microcomputer outputs "H (high=1)" or "L (low=0)" to one of the output terminals 10a to 10f in accordance with the characteristics (FIG. 4) so as to obtain an optimal steering feeling on the basis of the input vehicle speed and steering angle data. In this case, the terminals are weighted in an order of $10a > 10b > 10c > 10d > 10e > 10f$.

When the vehicle speed is low, the power steering system requires a large steering force, and therefore, a flow rate of the oil delivered from the pump must be increased. For this purpose, the speed of the electric motor for the oil pump must also be increased. Therefore, the microcomputer 10 selectively sends a control signal to the output terminals 10a to 10f. This control signal designates an increase in duty ratio of a control pulse signal applied to the electric motor. If pulses of "H" level appear at all the output terminals 10a to 10f, a voltage appearing at the noninverting input terminal of the comparator 14 becomes maximum.

When the vehicle speed is high, the flow rate of the oil delivered from the oil pump must be decreased because a steering angle must be decreased. For this purpose, the speed of the electric motor for the oil pump must be decreased. Therefore, the microcomputer sends a control signal to the output terminals 10a to 10f. The control signal designates a decrease in duty ratio of the control pulse signal applied to the electric motor. If pulses of "L" level appear at all the output terminals 10a to 10f, a voltage appearing at the noninverting input terminal of the comparator 14 becomes minimum.

The voltage V appearing at the noninverting input terminal of the comparator 14 can be represented by the following equation.

$$V = \{\tfrac{1}{2}\cdot(10a) + \tfrac{1}{4}\cdot(10b) + \tfrac{1}{8}\cdot(10c) + 1/16 \cdot(10d) + 1/32 \cdot(10e) + 1/64\cdot(10f)\}$$

Figure 3:
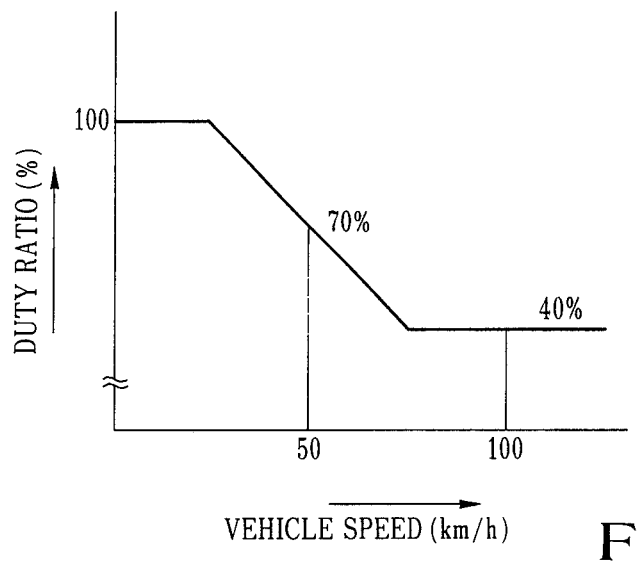
FIG. 3 is a showing a relationship between a vehicle speed and a duty ratio.

If the vehicle speed-duty ratio characteristic curve is given as shown in FIG. 3, in order to obtain a steering force corresponding to a given vehicle speed, the duty ratio can be defined as follows:
Duty ratio: 100% for zero speed
Duty ratio: 70% at 50 km/h
Duty ratio: 40% at 100 km/h If a triangular wave output max from the triangular wave generator is given as 4V and its output min is given as 2V, the relationship between the output terminals 10a to 10f of the microcomputer and the voltage levels of the outputs of the ladder resistor circuit 12, that is, the voltage levels supplied to the noninverting input terminal of the comparator 14 is given as follows, provided that "H" is represented by "1" and "L" is represented by "0".

| Duty Ratio | Microcomputer Output Terminal | | | | | | Noninverting Input Terminal Voltage of Comparator |
|---|---|---|---|---|---|---|---|
| | 10a | 10b | 10c | 10d | 10e | 10f | |
| 100% | 1 | 1 | 1 | 1 | 1 | 1 | ≈5 V |
| 70% | 1 | 0 | 1 | 0 | 1 | 0 | ≈3.3 V |
| 40% | 1 | 0 | 0 | 1 | 0 | 0 | ≈2.8 V |

According to this embodiment, the microcomputer is additionally arranged in the system, and the PWM signal can be obtained through the comparator 14 on the basis of the bit signal from the microcomputer 10. Therefore, the capacity of the memory for storing the program for generating the PWM signal in the microcomputer cannot be increased. A small-capacity microcomputer can be used. The time required for causing the microcomputer 10 to perform pulse width modulation of the pulse signal output from the comparator 14 can be greatly shortened as compared with an arrangement wherein the microcomputer itself generates the PWM signal. The time required for generating the PWM signal having a higher priority need not be long, and other operations will not be interfered by PWM signal generation. A low-speed, inexpensive microcomputer can be used. In other words, a low-end microcomputer having at least output terminals of the bit signal can be used to greatly reduce the cost.

In the above embodiment, pulse width modulation is performed by utilizing the microcomputer 10 in the power steering apparatus. However, the present invention is not limited to the power steering apparatus, but is applicable to other various circuits.

The motor speed control apparatus according to the present invention comprises the ladder resistor means, an output voltage value of which is changed in accordance with an input position of the bit signal, the triangular wave generating means for generating the triangular wave voltage signal, and comparing means for comparing the signal voltage value of the triangular wave voltage signal output from the triangular wave generating means with the output voltage value of the ladder resistor means and for changing a pulse width of the pulse signal on the basis of the comparison result. Therefore, the microcomputer can be additionally used to generate the PWM signal on the basis of the bit signal from the microcomputer. Therefore, a low-end microcomputer in a power steering apparatus or the like can be used.

In the above embodiment, the triangular wave is used. However, a wave having any shape, such as a saw-toothed wave, a sinusoidal wave, or a cosin wave, may be used if the wave level is periodically changed. Furthermore, the ladder resistor means in the embodiment is a 2R-R ladder resistor circuit. However, any other resistor circuit may be used in place of the 2R-R ladder resistor circuit.

What is claimed is:
1. A motor speed control apparatus comprising:
(a) vehicle measurement information generating means for generating measurement information vehicle speed and steering angle;
(b) ladder resister means for selectively receiving a voltage signal having a predetermined amplitude at a plurality of nodes, said ladder resister means being arranged to change an output voltage value thereof in accordance with a voltage application position;
(c) a microcomputer for receiving said vehicle measurement information from said vehicle measurement information generating means, and for, in accordance with said measurement information, supplying motor control information to said plurality of nodes of said ladder resister means in the form of the voltage signal having the predetermined amplitude;
(d) reference signal generating means for generating a triangular reference signal; and
(e) comparing means for comparing a voltage value of the triangular reference signal with an output voltage value of said ladder resister means and outputting a pulse output having a variable pulse width on the basis of a comparison result, wherein a motor speed is controlled on the basis of the pulse output.

* * * * *

UNITED STATES PATENT AND TRADEMARK OFFICE
CERTIFICATE OF CORRECTION

PATENT NO. : 4,871,952

DATED : 10/3/89

INVENTOR(S) : Ishizaka et al.

It is certified that error in the above-identified patent and that said Letters Patent is hereby corrected as shown below:

| | | |
|---|---|---|
| col. 02, line 33 | after "is a" | insert --graph-- |
| col. 04, line 30 | before "The", delete "2." | insert --12.-- |
| col. 05, line 61 | after "microcomputer" | insert --10-- |
| col. 06, line 43 | after "information" | insert --including-- |

Signed and Sealed this

Fourteenth Day of May, 1991

*Attest:*

HARRY F. MANBECK, JR.

*Attesting Officer*     *Commissioner of Patents and Trademarks*